(12) United States Patent
Sun

(10) Patent No.: US 8,513,530 B2
(45) Date of Patent: Aug. 20, 2013

(54) PACKAGE CARRIER AND MANUFACTURING METHOD THEREOF

(75) Inventor: Shih-Hao Sun, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 273 days.

(21) Appl. No.: 13/161,479

(22) Filed: Jun. 15, 2011

(65) Prior Publication Data

US 2012/0279760 A1    Nov. 8, 2012

(30) Foreign Application Priority Data

May 3, 2011    (TW) .............................. 100115472 A

(51) Int. Cl.
*H05K 7/20*    (2006.01)
*H05K 3/00*    (2006.01)

(52) U.S. Cl.
USPC ........................................ 174/252; 29/829

(58) Field of Classification Search
CPC ........................................................ H05K 7/20
USPC .......................................... 174/252; 29/829
See application file for complete search history.

*Primary Examiner* — Timothy Thompson
*Assistant Examiner* — Charles Pizzuto
(74) *Attorney, Agent, or Firm* — Jianq Chyun IP Office

(57) ABSTRACT

A manufacturing method of a package carrier is provided. A substrate having a first surface, a second surface, and an opening communicating the first and second surfaces opposite to each other is provided. A first adhesive layer is formed on the first surface of the substrate. The first adhesive layer and the substrate define a notch. A thermal-conductive element is configured in the notch and fixed into the notch via the first adhesive layer. A second adhesive layer and a metal layer located on the second adhesive layer are formed on the second surface of the substrate. The metal layer is connected to a bottom surface of the thermal-conductive element. The thermal-conductive element is located between the metal layer and the first adhesive layer. The first adhesive layer is removed to expose the first surface of the substrate.

7 Claims, 7 Drawing Sheets

PACKAGE CARRIER AND MANUFACTURING METHOD THEREOF

CROSS-REFERENCE TO RELATED APPLICATION

This application claims the priority benefit of Taiwan application serial no. 100115472, filed May 3, 2011. The entirety of the above-mentioned patent application is hereby incorporated by reference herein and made a part of this specification.

BACKGROUND OF THE INVENTION

1. Field of the Invention

The invention relates to a package structure and a manufacturing method thereof. More particularly, the invention relates to a package carrier and a manufacturing method thereof.

2. Description of Related Art

A chip package provides a chip with proper signal and heat transmission paths and protects the chip structure. A leadframe often serves as a carrier of the chip when a conventional wire bonding technique is applied. As contact density in the chip gradually increases, the leadframe is no longer able to further improve the contact density and thus can be replaced by a package carrier which can achieve favorable contact density. Besides, the chip is packaged onto the package carrier by conductive media, such as metal conductive wires or bumps.

In a common light emitting diode (LED) package structure, an LED chip need be packaged before the LED chip is used, and the LED chip generates a significant amount of heat when emitting light. Given the heat cannot be dissipated and continues to accumulate in the LED package structure, the temperature of the LED package structure is increasingly raised. As such, the overly heated LED chip may have luminance decay, shortened life span, or even permanent damages. Therefore, heat sinks are usually configured in the existing LED package structure, so as to dissipate heat of the LED chip.

The conventional package carrier is comprised of a plurality of patterned conductive layers and at least one insulation layer. The insulation layer is configured between two adjacent patterned conductive layers for electrical insulation. A thermal-conductive block is fixed onto a bottom surface of the package carrier via an adhesive layer. In most cases, the LED chip is electrically connected to the package carrier, and heat generated by the LED chip can be conducted to the thermal-conductive block through the patterned conductive layers and the insulation layer. Since the thermal conductivity of the adhesive layer and the insulation layer is unfavorable, thermal resistance increases when the heat generated by the LED chip is conducted to the thermal-conductive block through the insulation layer and the adhesive layer, which leads to unsatisfactory heat dissipation. Hence, how to dissipate the heat generated by the LED chip to the external surroundings in an efficient manner has become a focus to researchers and designers in this field.

SUMMARY OF THE INVENTION

The invention is directed to a package carrier for carrying a heat-generating element.

The invention is further directed to a manufacturing method of a package carrier. By applying the manufacturing method, the aforesaid package carrier can be formed.

In an embodiment of the invention, a manufacturing method of a package carrier includes following steps. A substrate is provided. The substrate has a first surface, a second surface, and an opening that communicates the first and second surfaces opposite to each other. A first adhesive layer is formed on the first surface of the substrate. The first adhesive layer and the substrate define a notch. A thermal-conductive element is configured in the notch and fixed into the notch via the first adhesive layer. A second adhesive layer and a metal layer that is located on the second adhesive layer are formed on the second surface of the substrate. Here, the metal layer is connected to a bottom surface of the thermal-conductive element, and the thermal-conductive element is located between the metal layer and the first adhesive layer. The first adhesive layer is removed to expose the first surface of the substrate.

According to an embodiment of the invention, the manufacturing method further includes following steps. When the second adhesive layer and the metal layer are formed on the second surface of the substrate, the bottom surface of the thermal-conductive element is covered by the second adhesive layer, and the thermal-conductive element is located between the first adhesive layer and the second adhesive layer. A portion of the metal layer and a portion of the second adhesive layer are removed to expose a portion of the bottom surface of the thermal-conductive element. A plurality of conductive pillars is formed on the exposed portion of the bottom surface of the thermal-conductive element. Here, the thermal-conductive element is connected to the metal layer via the conductive pillars, and the conductive pillars and a surface the metal layer away from the second adhesive layer are substantially coplanar.

According to an embodiment of the invention, the second adhesive layer is located between the second surface of the substrate and the metal layer, the metal layer has an accommodating concave, and the bottom surface of the thermal-conductive element is configured in the accommodating concave.

According to an embodiment of the invention, the second adhesive layer is located between the second surface of the substrate and the metal layer, the metal layer has a protrusion, and the bottom surface of the thermal-conductive element is configured on the protrusion.

According to an embodiment of the invention, the thermal-conductive element includes a first conductive layer, a second conductive layer, and an insulation material layer that is located between the first conductive layer and the second conductive layer.

According to an embodiment of the invention, a material of the insulation material layer is ceramics.

According to an embodiment of the invention, the substrate includes an insulation layer and a patterned copper layer that is located on the insulation layer. Here, the patterned copper layer exposes a portion of the insulation layer, and the manufacturing method further includes forming a solder mask layer on the patterned copper layer and the portion of the insulation layer after the first adhesive layer is removed.

In an embodiment of the invention, a package carrier for carrying a heat-generating element is provided. The package carrier includes a substrate, an adhesive layer, a metal layer, and a thermal-conductive element. The substrate has a first surface, a second surface, and an opening that communicates the first and second surfaces opposite to each other. The adhesive layer is configured on the second surface of the substrate. The metal layer is adhered to the substrate via the adhesive layer, and the metal layer and the opening define an accommodating space. The thermal-conductive element is configured in the accommodating space and has a top surface and a bottom surface. The top surface and the bottom surface are opposite to each other. The metal layer is connected to the bottom surface of the thermal-conductive element. The heat-generating element is configured on the top surface of the thermal-conductive element.

According to an embodiment of the invention, the thermal-conductive element includes a first conductive layer, a second conductive layer, and an insulation material layer that is located between the first conductive layer and the second conductive layer.

According to an embodiment of the invention, a material of the insulation material layer is ceramics.

According to an embodiment of the invention, the package carrier further includes a plurality of conductive pillars. The adhesive layer is extended between the bottom surface of the thermal-conductive element and the metal layer. The conductive pillars penetrate the metal layer and the adhesive layer, and the conductive pillars are connected to a portion of the bottom surface of the thermal-conductive element.

According to an embodiment of the invention, the adhesive layer is located between the second surface of the substrate and the metal layer, the metal layer has an accommodating concave, and the bottom surface of the thermal-conductive element is configured in the accommodating concave.

According to an embodiment of the invention, the adhesive layer is located between the second surface of the substrate and the metal layer, the metal layer has a protrusion, and the bottom surface of the thermal-conductive element is configured on the protrusion.

According to an embodiment of the invention, the substrate includes an insulation layer and a patterned copper layer that is located on the insulation layer. The patterned copper layer exposes a portion of the insulation layer.

According to an embodiment of the invention, the package carrier further includes a solder mask layer that is configured on the patterned copper layer and the portion of the insulation layer.

Based on the above, the package carrier described in the above embodiments has the thermal-conductive element. Hence, when a heat-generating element is configured on the thermal-conductive element of the package carrier, the heat generated by the heat-generating element can be rapidly transmitted to the external surroundings through the thermal-conductive element and the metal layer. As such, the package carrier described in the embodiments of the invention can effectively dissipate the heat generated by the heat-generating element, and the efficiency and the life span of the heat-generating element can both be increased.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
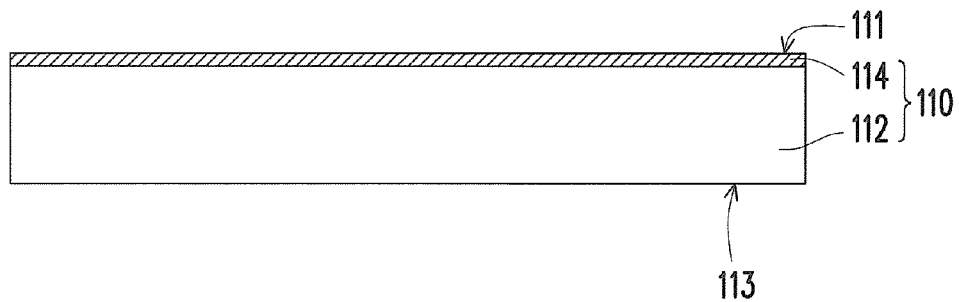
FIG. 1A to FIG. 1I are schematic cross-sectional views illustrating a manufacturing method of a package carrier according to an embodiment of the invention.

FIG. 1A to FIG. 1I are schematic cross-sectional views illustrating a manufacturing method of a package carrier according to an embodiment of the invention. As indicated in FIG. 1A, according to the manufacturing method of a package carrier in this embodiment, a substrate 110 is provided. The substrate 110 has a first surface 111 and a second surface 113 opposite to the first surface 111. The substrate 110 is constituted by an insulation layer 112 and a copper layer 114 that is located on the insulation layer 112. Here, the insulation layer 112 is made of polyimide (PI) or epoxy resin, for instance. In other embodiments that are not shown in the drawings, the substrate can also be a double-sided board that is constituted by one insulation layer and two copper foil layers that are located at two respective sides of the insulation layer.

Figure 1B:
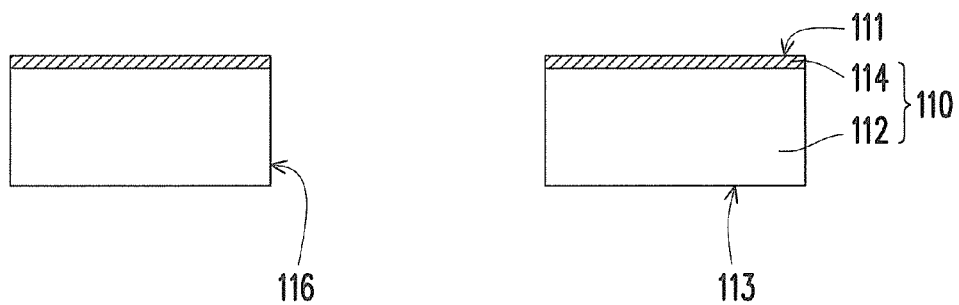

With reference to FIG. 1B, an opening 116 that communicates the first surface 111 and the second surface 113 of the substrate 110 is formed by stamping or routing, for instance.

Figure 1C:
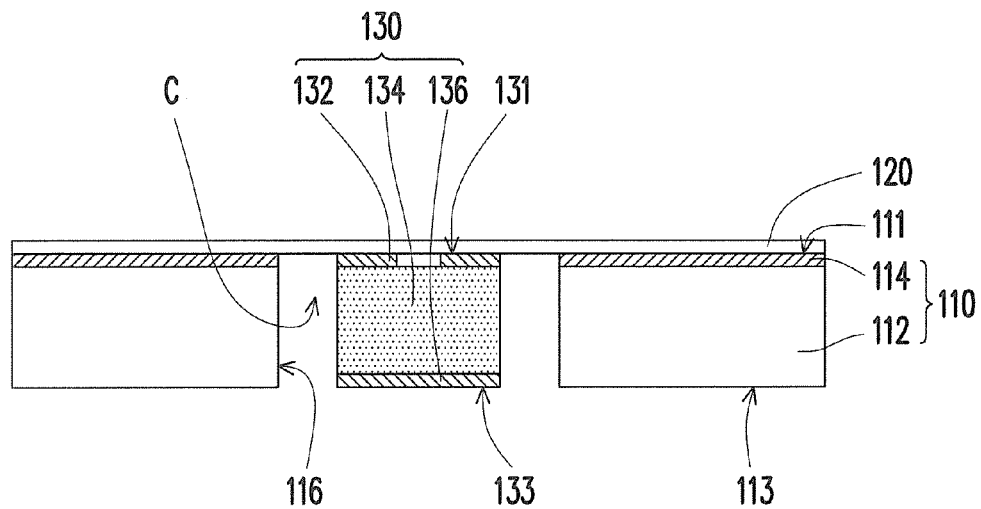

With reference to FIG. 1C, a first adhesive layer 120 is formed on the first surface 111 of the substrate 110. Here, the first adhesive layer 120 and the substrate 110 define a notch C. A thermal-conductive element 130 is configured in the notch C. The thermal-conductive element 130 has a top surface 131 and a bottom surface 133 that are opposite to each other, and the thermal-conductive element 130 is fixed into the notch C via the first adhesive layer 120. Specifically, the thermal-conductive element 130 includes a first conductive layer 132, an insulation material layer 134, and a second conductive layer 136. The insulation material layer 134 is located between the first conductive layer 132 and the second conductive layer 136. Besides, the insulation material layer 134 is made of a ceramic material, e.g., $Al_2O_3$, aluminum nitride (AlN), silicon nitride (SiN), or graphite. The first conductive layer 132 of the thermal-conductive element 130 can be a patterned conductive layer and is adhered to the first adhesive layer 120.

Figure 1D:
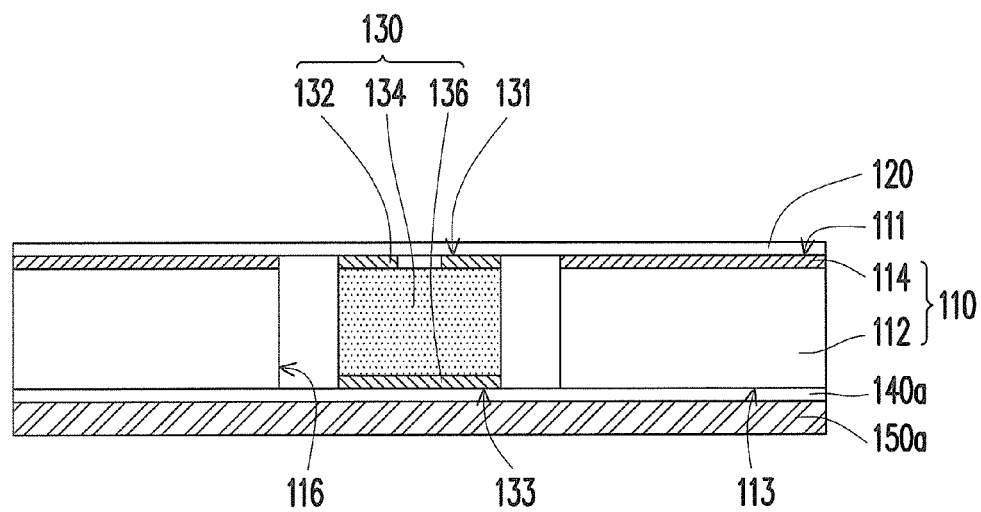

With reference to FIG. 1D, a second adhesive layer 140a and a metal layer 150a that is located on the second adhesive layer 140a are formed on the second surface 113 of the substrate 110. The second adhesive layer 140a covers the bottom surface 133 of the thermal-conductive element 130, and the thermal-conductive element 130 is located between the first adhesive layer 120 and the second adhesive layer 140a. The metal layer 150a is a single metal layer, an alloy layer, or a metal compound layer, for instance.

Figure 1E:
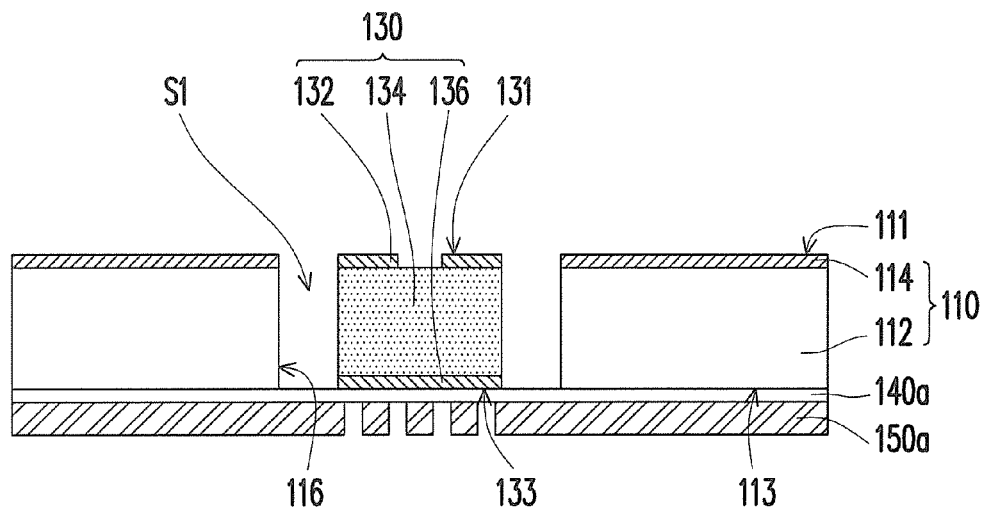

With reference to FIG. 1E, the first adhesive layer 120 is removed to expose the first surface 111 of the substrate 110. The second adhesive layer 140a and the opening 116 define an accommodating space S1, and the thermal-conductive layer 130 is located in the accommodating space S1. A portion of the metal layer 150a is removed to expose a portion of the second adhesive layer 140a. The metal layer 150a is removed by physical etching or chemical etching, for instance.

Figure 1F:
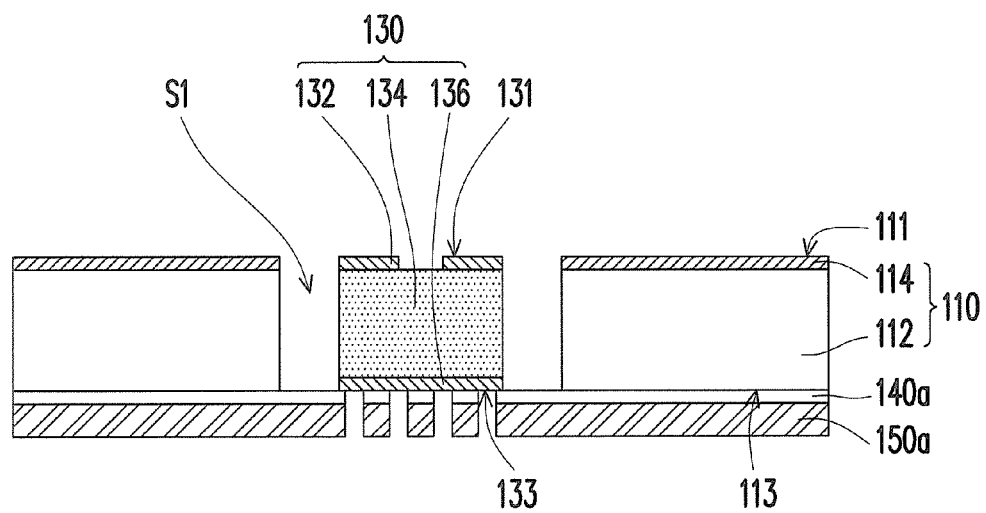

With reference to FIG. 1F, a portion of the second adhesive layer 140a is removed to expose a portion of the bottom surface 133 of the thermal-conductive element 130. Here, the method of removing the second adhesive layer 140a includes laser treatment or plasma treatment.

Although the first adhesive layer 120, the portion of the metal layer 150a, and the portion of the second adhesive layer 140a are sequentially removed in this embodiment, it should be mentioned that the order of removing the first adhesive layer 120, the portion of the metal layer 150a, and the portion of the second adhesive layer 140a is not limited in the invention. According to other embodiments of the invention, the metal layer 150a and the second adhesive layer 140a can be partially removed, and then the first adhesive layer 120 is removed.

Figure 1G:
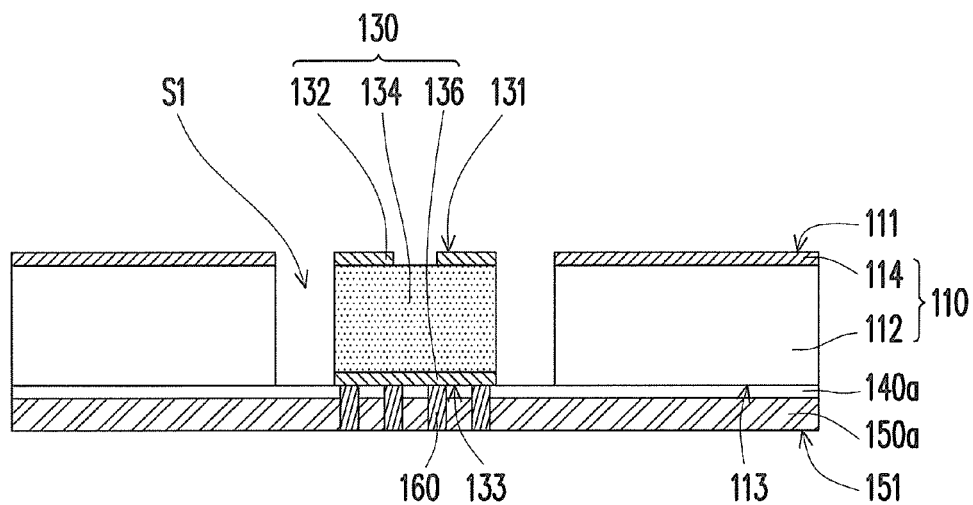

With reference to FIG. 1G, a plurality of conductive pillars 160 is formed on the exposed portion of the bottom surface 133 of the thermal-conductive element 130. The second conductive layer 136 of the thermal-conductive element 130 is connected to the metal layer 150a via the conductive pillars 160. Here, the conductive pillars 160 and a surface 151 of the metal layer 150a away from the second adhesive layer 140a are substantially coplanar. Here, the method of forming the conductive pillars 160 includes electroplating or electroless plating.

Figure 1H:
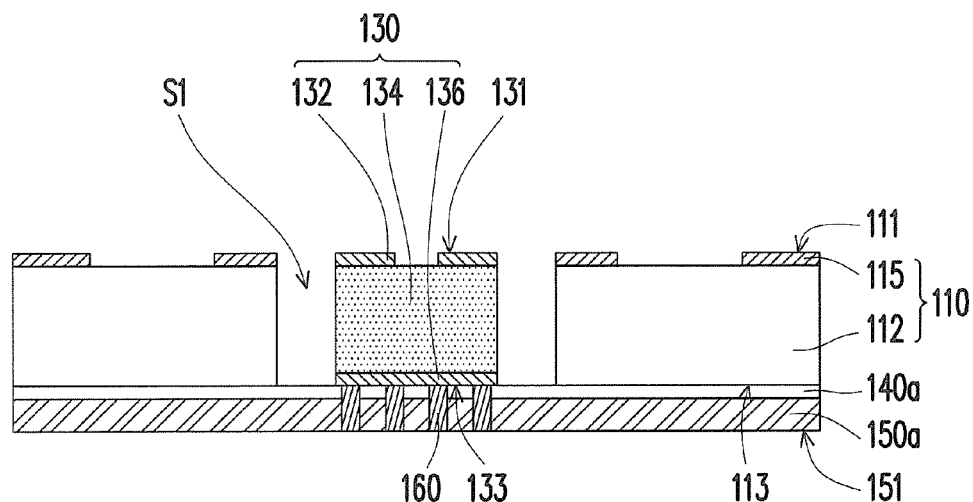

With reference to FIG. 1H, the copper layer 114 of the substrate 110 is patterned to form a patterned copper layer 115. Here, the patterned copper layer 115 exposes a portion of the insulation layer 112.

Figure 1I:
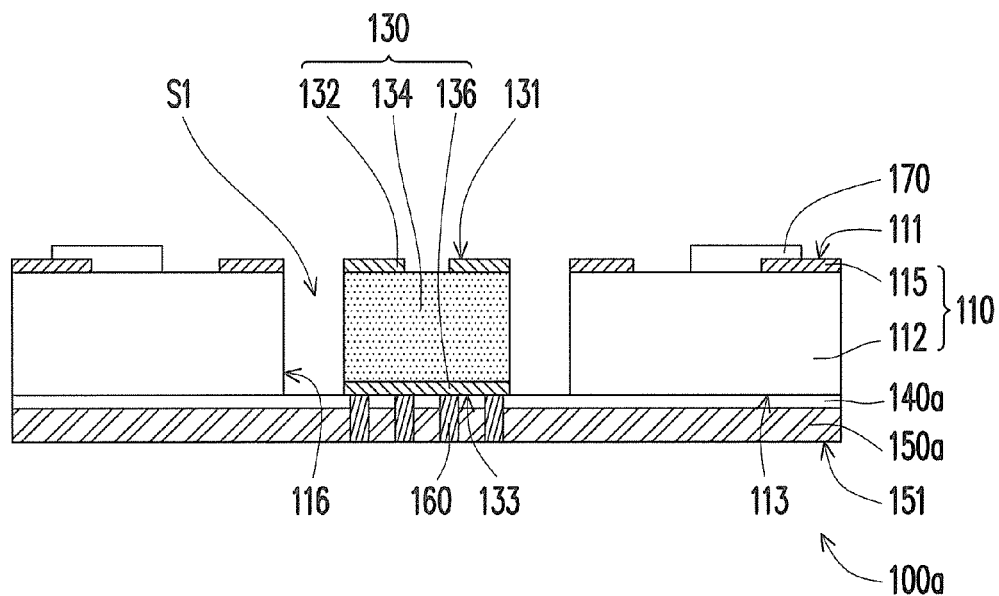

With reference to FIG. 1I, a solder mask layer 170 is formed on the patterned copper layer 115 and the portion of the insulation layer 112. So far, fabrication of the package carrier 100a is substantially completed.

As indicated in FIG. 1I, the package carrier 100a of this embodiment structurally includes the substrate 110, the thermal-conductive element 130, the second adhesive layer 140a, the metal layer 150a, the conductive pillars 160, and the solder mask layer 170. The substrate 110 has the first surface 111 and the second surface 113 that are opposite to each other. Besides, the substrate 110 has the opening 116 that communicates the first surface 111 and the second surface 113. The substrate 110 is constituted by the insulation layer 112 and the patterned copper layer 115. The patterned copper layer 115 exposes a portion of the insulation layer 112. The thermal-conductive element 130 has the top surface 131 and the bottom surface 133 that are opposite to each other. Here, the thermal-conductive element 130 includes the first conductive layer 132, the insulation material layer 134, and the second conductive layer 136. The insulation material layer 134 is located between the first conductive layer 132 and the second conductive layer 136. The first conductive layer 132 can be a patterned conductive layer. The second adhesive layer 140a is configured on the second surface 113 of the substrate 110 and the bottom surface 133 of the thermal-conductive element 130. Here, the second adhesive layer 140a and the opening 116 define the accommodating space S1, and the thermal-conductive element 130 is configured in the accommodating space S1. The metal layer 150a is adhered to the substrate 110 via the second adhesive layer 140a. The conductive pillars 160 penetrate the metal layer 150a and the second adhesive layer 140a, and the conductive pillars 160 are connected to a portion of the bottom surface 133 of the thermal-conductive element 130. The solder mask layer 170 is configured on the patterned copper layer 115 and the portion of the insulation layer 112 of the substrate 110.

Figure 1J:
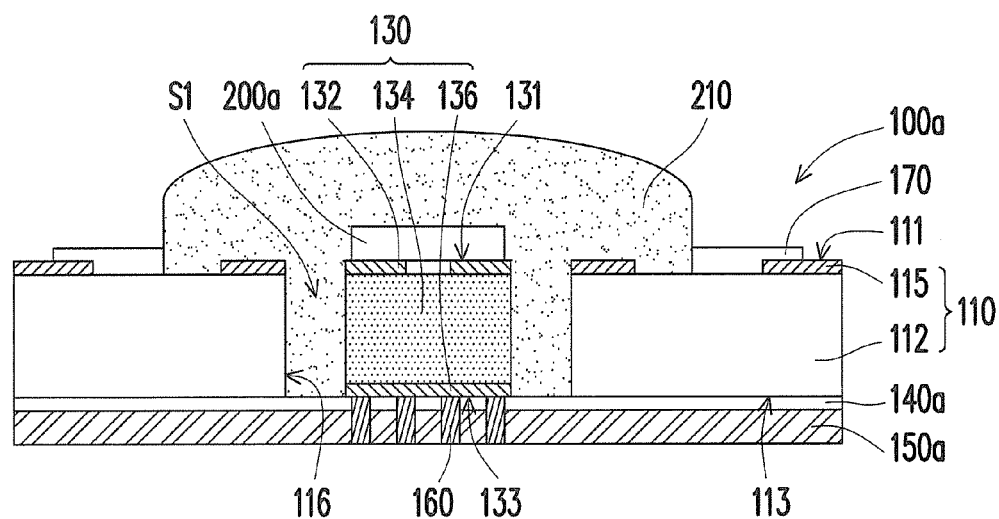
FIG. 1J is a schematic cross-sectional view illustrating that the package carrier depicted in FIG. 1I carries a heat-generating element.

FIG. 1J is a schematic cross-sectional view illustrating that the package carrier depicted in FIG. 1I carries a heat-generating element. With reference to FIG. 1J, in this embodiment, the package carrier 100a is suitable for carrying a heat-generating element 200a. The heat-generating element 200a is configured on the first conductive layer 132 of the thermal-conductive element 130. Here, the heat-generating element 200a is an electronic chip or a photoelectric device, for instance, which should not be construed as a limitation to the invention. For instance, the electronic chip can be an integrated circuit (IC) chip, e.g., a chip module or an individual chip that includes a graphic chip, a memory chip, and so on. The photoelectric device is an LED, a laser diode, or a gas discharge light source, for instance. In this embodiment, the heat-generating element 200a is an LED, for instance.

Specifically, the heat-generating element 200a (e.g., the LED) can be electrically connected to the first conductive layer 132 of the thermal-conductive element 130 by flip-chip bonding. The heat-generating element 200a and a portion of the package carrier 100a can be encapsulated by a molding compound 210 for protecting the electrical connection between the heat-generating element 200a and the package carrier 100a. The heat-generating element 200a of this embodiment is directly configured on the thermal-conductive element 130 of the package carrier 100a. Hence, the heat generated by the heat-generating element 200a can be rapidly transmitted to the external surroundings via the thermal-conductive element 130, the conductive pillars 160, and the metal layer 150a. As such, the package carrier 100a described in the embodiments of the invention can effectively dissipate the heat generated by the heat-generating element 200a, and the efficiency and the life span of the heat-generating element 200a can both be increased.

Figure 2:
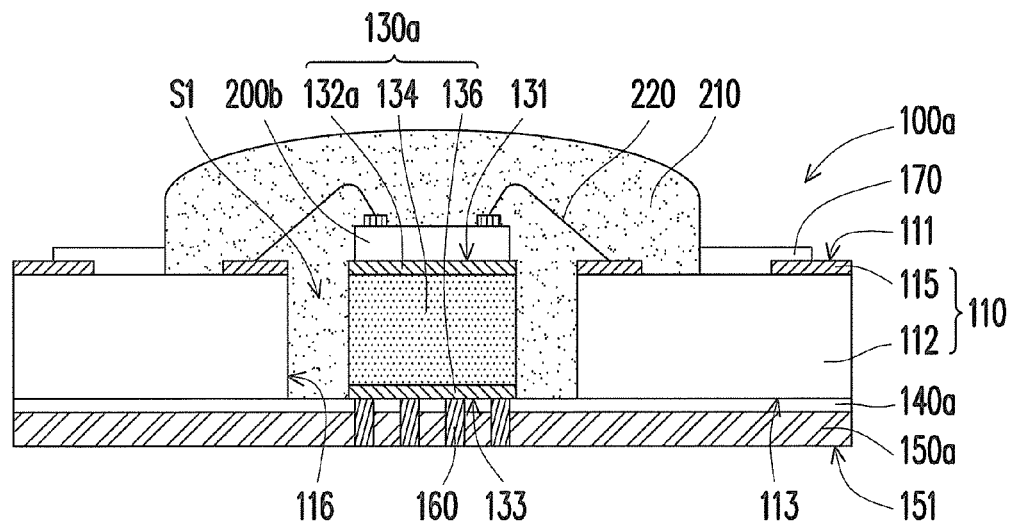
FIG. 2 is a schematic cross-sectional view illustrating that a package carrier carries a heat-generating element according to an embodiment of the invention.

Although the heat-generating element 200a described in this embodiment is electrically connected to thermal-conductive element 130 of the package carrier 100a by flip-chip bonding, the way to connect the heat-generating element 200a and the package carrier 100a and the type of the heat-generating element 200a are not limited in the invention. In another embodiment, as shown in FIG. 2, the heat-generating element 200b can be electrically connected to the first conductive layer 132a of the thermal-conductive element 130a of the package carrier 100a through a plurality of bonding wires 220 (i.e., by wire bonding). The heat-generating element can also be a chip package in another embodiment that is not shown, and the heat-generating element is configured on the package carrier 100a by conducting a surface mount technology (SMT). Note that the way to connect the heat-generating elements 200a and 200b to the package carrier 100a and the type of the heat-generating elements 200a and 200b are exemplary and should not be construed as limitations to the invention.

The package carriers 100b and 100c and the manufacturing method thereof are described hereinafter with reference to several embodiments. It should be mentioned that some reference numbers and some of the descriptions provided in the previous embodiments are also used in the following exemplary embodiment. The same reference numbers denote the same or like components, and descriptions of the same technical contents are omitted. The aforementioned exemplary embodiments can be referred for descriptions of the omitted parts, and thus the omitted parts are not further described in the following exemplary embodiments.

Figure 3:
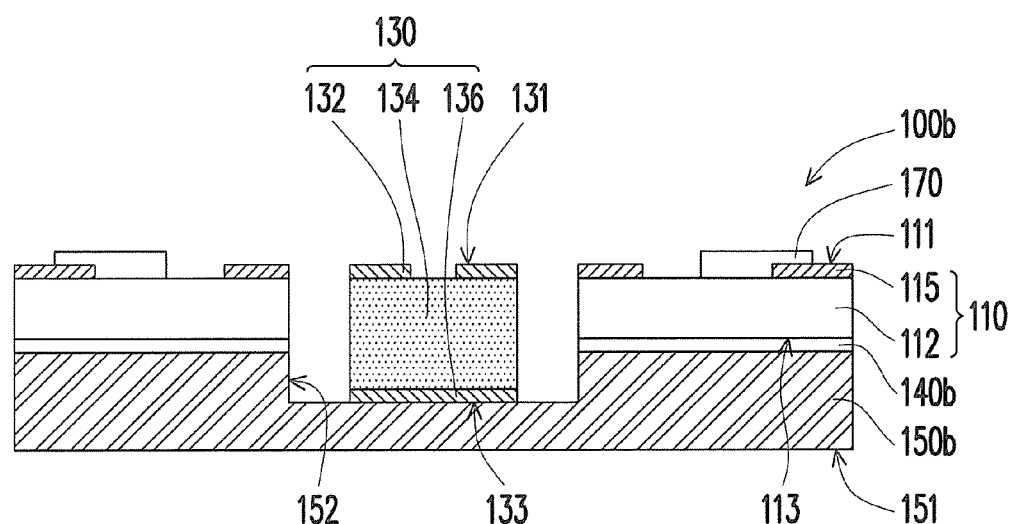
FIG. 3 is a schematic cross-sectional view illustrating another package carrier according to an embodiment of the invention.

FIG. 3 is a schematic cross-sectional view illustrating another package carrier according to an embodiment of the invention. With reference to FIG. 3, the package carrier 100b of this embodiment is similar to the package carrier 100a depicted in FIG. 1I, while the difference therebetween lies in that the package carrier 100b depicted in FIG. 3 does not have the conducive pillars 160 shown in FIG. 1I, and that the bottom surface 133 of the thermal-conductive element 130 is directly connected to the metal layer 150b. To be more specific, the second adhesive layer 140b of the package carrier 100b in this embodiment is located between the second surface 113 of the substrate 110 and the metal layer 150b. The metal layer 150b has an accommodating concave 152 in which the thermal-conductive element 130 is configured. The bottom surface 133 of the thermal-conductive element 130 is in direct contact with the metal layer 150b.

The manufacturing method of the package carrier 100b in this embodiment can be approximately the same as the manufacturing method of the package carrier 100a described in the previous embodiment. Namely, as shown in FIG. 1C, the first adhesive layer 120 is formed on the first surface 111 of the substrate 110, and the first adhesive layer 120 and the substrate 110 define the notch C. The second adhesive layer 140b and the metal layer 150b that is located on the second adhesive layer 140b are then formed on the second surface 113 of the substrate 110. The metal layer 150b has the accommodating concave 152 in which the thermal-conductive element 130 is configured. The bottom surface 133 of the thermal-conductive element 130 is in direct contact with the metal layer 150b. The first adhesive layer 120 is removed (as shown in FIG. 1D), and the steps shown in FIG. 1H and FIG. 1I are sequentially performed to complete the fabrication of the package carrier 100b.

Subsequently, when the heat-generating element, e.g., an LED chip (not shown), is electrically connected to the first conductive layer 132 of the thermal-conductive element 130 of the package carrier 100b by wire bonding or flip-chip bonding, the heat generated by the heat-generating element can be rapidly transmitted to the external surroundings via the thermal-conductive element 130 and the metal layer 150b directly. In brief, the package carrier 100b described in this embodiment can effectively dissipate the heat generated by the heat-generating element, and the efficiency and the life span of the heat-generating element can both be increased.

Figure 4:
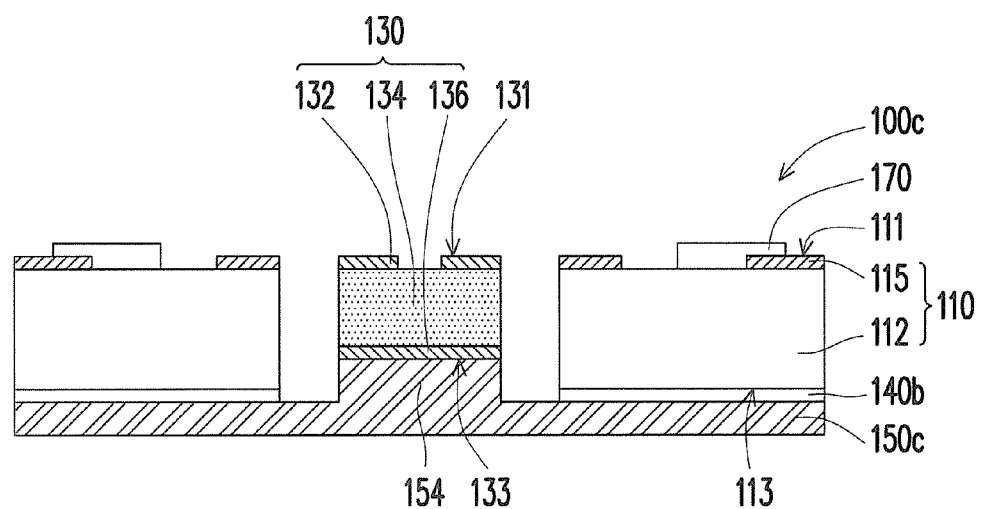
FIG. 4 is a schematic cross-sectional view illustrating still another package carrier according to an embodiment of the invention.

FIG. 4 is a schematic cross-sectional view illustrating still another package carrier according to an embodiment of the invention. With reference to FIG. 4, the package carrier 100c of this embodiment is similar to the package carrier 100b depicted in FIG. 3, while the difference therebetween lies in that the second metal layer 150c of the package carrier 100c in FIG. 4 has a protrusion 154 on which the thermal-conductive layer 130 is configured, and that the bottom surface 133 of the thermal-conductive element 130 is in direct contact with the protrusion 154.

The manufacturing method of the package carrier 100c in this embodiment can be approximately the same as the manufacturing method of the package carrier 100b described in the previous embodiment. Namely, as shown in FIG. 1C, the first adhesive layer 120 is formed on the first surface 111 of the substrate 110, and the first adhesive layer 120 and the substrate 110 define the notch C. The second adhesive layer 140b and the metal layer 150c that is located on the second adhesive layer 140b are then formed on the second surface 113 of the substrate 110. The metal layer 150c has the protrusion 154 on which the thermal-conductive element 130 is configured. The bottom surface 133 of the thermal-conductive element 130 is in direct contact with the protrusion 154. The first adhesive layer 120 is removed (as shown in FIG. 1D), and the steps shown in FIG. 1H and FIG. 1I are sequentially performed to complete the fabrication of the package carrier 100c.

Subsequently, when the heat-generating element, e.g., an LED chip (not shown), is electrically connected to the first conductive layer 132 of the thermal-conductive element 130 of the package carrier 100c by wire bonding or flip-chip bonding, the heat generated by the heat-generating element can be rapidly transmitted to the external surroundings via the thermal-conductive element 130 and the metal layer 150c directly. In brief, the package carrier 100c described in this embodiment can effectively dissipate the heat generated by the heat-generating element, and the efficiency and the life span of the heat-generating element can both be increased.

In light of the foregoing, the package carrier described in the above embodiments has the thermal-conductive element. Hence, when a heat-generating element is configured on the thermal-conductive element of the package carrier, the heat generated by the heat-generating element can be rapidly transmitted to the external surroundings through the thermal-conductive element and the metal layer directly. As such, the package carrier described in the embodiments of the invention can effectively dissipate the heat generated by the heat-generating element, and the efficiency and the life span of the heat-generating element can both be increased.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:

1. A package carrier for carrying a heat-generating element, the package carrier comprising: a substrate having a first surface, a second surface, and an opening communicating the first and second surfaces opposite to each other; an adhesive layer configured on the second surface of the substrate; a metal layer adhered to the substrate via the adhesive layer, the metal layer and the opening defining an accommodating space; and a thermal-conductive element configured in the accommodating space and having a top surface and a bottom surface, the top surface and the bottom surface being opposite to each other, the metal layer being connected to the bottom surface of the thermal-conductive element, the heat-generating element being configured on the top surface of the thermal-conductive element; further comprising a plurality of conductive pillars, the adhesive layer being extended between the bottom surface of the thermal-conductive element and the metal layer, the conductive pillars penetrating the metal layer and the adhesive layer and connecting a portion of the bottom surface of the thermal-conductive element.

2. The package carrier as recited in claim 1, wherein the thermal-conductive element comprises a first conductive layer, a second conductive layer, and an insulation material layer located between the first conductive layer and the second conductive layer.

3. The package carrier as recited in claim 2, wherein a material of the insulation material layer is ceramics.

4. The package carrier as recited in claim 1, wherein the adhesive layer is located between the second surface of the substrate and the metal layer, the metal layer has an accommodating concave, and the bottom surface of the thermal-conductive element is configured in the accommodating concave.

5. The package carrier as recited in claim 1, wherein the adhesive layer is located between the second surface of the substrate and the metal layer, the metal layer has a protrusion, and the bottom surface of the thermal-conductive element is configured on the protrusion.

6. The package carrier as recited in claim 1, wherein the substrate comprises an insulation layer and a patterned copper layer located on the insulation layer, and the patterned copper layer exposes a portion of the insulation layer.

7. The package carrier as recited in claim 6, further comprising a solder mask layer configured on the patterned copper layer and the portion of the insulation layer.

* * * * *